(12) United States Patent
Jain

(10) Patent No.: US 11,532,335 B2
(45) Date of Patent: Dec. 20, 2022

(54) MEMORY DEVICE AND POWER MANAGEMENT METHOD USING THE SAME

(71) Applicant: Taiwan Semiconductor Manufacturing Company, Ltd., Hsinchu (TW)

(72) Inventor: Sanjeev Kumar Jain, Ottawa (CA)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 29 days.

(21) Appl. No.: 17/031,925

(22) Filed: Sep. 25, 2020

(65) Prior Publication Data

US 2021/0241803 A1    Aug. 5, 2021

Related U.S. Application Data

(60) Provisional application No. 62/968,165, filed on Jan. 31, 2020.

(51) Int. Cl.
  *G11C 8/08*    (2006.01)
  *G11C 5/14*    (2006.01)

(52) U.S. Cl.
  CPC .............. *G11C 5/148* (2013.01); *G11C 8/08* (2013.01)

(58) Field of Classification Search
  CPC ......... G11C 5/148; G11C 8/08; G11C 11/417; G11C 11/418; G11C 5/147

USPC .......................................................... 365/227
See application file for complete search history.

(56) References Cited

U.S. PATENT DOCUMENTS

| | | | |
|---|---|---|---|
| 2011/0110174 A1* | 5/2011 | Cho ........................ | G11C 7/22 365/207 |
| 2013/0135941 A1* | 5/2013 | Reohr ................ | G11C 11/4085 365/189.02 |
| 2013/0191665 A1* | 7/2013 | Mehta ................... | G06F 1/3275 713/322 |
| 2020/0136622 A1* | 4/2020 | Ramarajan ..... | H03K 19/018521 |

\* cited by examiner

*Primary Examiner* — Hoai V Ho
*Assistant Examiner* — Minh Dinh
(74) *Attorney, Agent, or Firm* — JCIPRNET

(57) ABSTRACT

A memory device that is operable at a first voltage domain and a second voltage domain includes a memory array, a power saving mode pin and a word line level shifter circuit. The memory array operates at the first voltage domain. The power saving mode pin is configured to receive a power saving mode enable signal that is at the second voltage domain. The power saving mode enable signal is configured to enable a power saving mode of the memory device. The word line level shifter circuit is coupled to the memory array and the power saving mode pin, and is configured to clamp a word line of the memory array to a predetermined voltage level that corresponds to a first logic state during the power saving mode of the memory device.

20 Claims, 6 Drawing Sheets

MEMORY DEVICE AND POWER MANAGEMENT METHOD USING THE SAME

CROSS-REFERENCE TO RELATED APPLICATION

This application claims the priority benefit of U.S. provisional application Ser. No. 62/968,165, filed on Jan. 31, 2020. The entirety of the above-mentioned patent application is hereby incorporated by reference herein and made a part of this specification.

BACKGROUND

A memory device may come with a power management mode or without the power management mode. In the memory device with the power management mode, a shutdown (SD) mode and a deep sleep (DSLP) mode may be implemented in the memory device to manage power consumption of the memory device. However, there exists a considerable leakage in the memory device with the existing power management modes (e.g., SD and DSLP modes), as an external power supply to the memory device are not switched off during the SD and DSLP mode and external memory array supply voltage is alive for retaining data in memory array in the DSLP mode. In the memory device without the power management mode, power management is performed at a system level and is shared for all the memory devices in the system. There is a large power dissipation and a large peak current as a word line level of the memory device is unknown during power up of external supply voltage.

As a demand for a memory device with high quality and low power consumption, a creative design of a memory device that is capable of lowering the power consumption is highly desired.

BRIEF DESCRIPTION OF THE DRAWINGS

Aspects of the present disclosure are best understood from the following detailed description when read with the accompanying figures. It is noted that, with the standard practice in the industry, various features are not drawn to scale. In fact, the dimensions of the various features may be arbitrarily increased or reduced for clarity of discussion.

DESCRIPTION OF THE EMBODIMENTS

Figure 1:
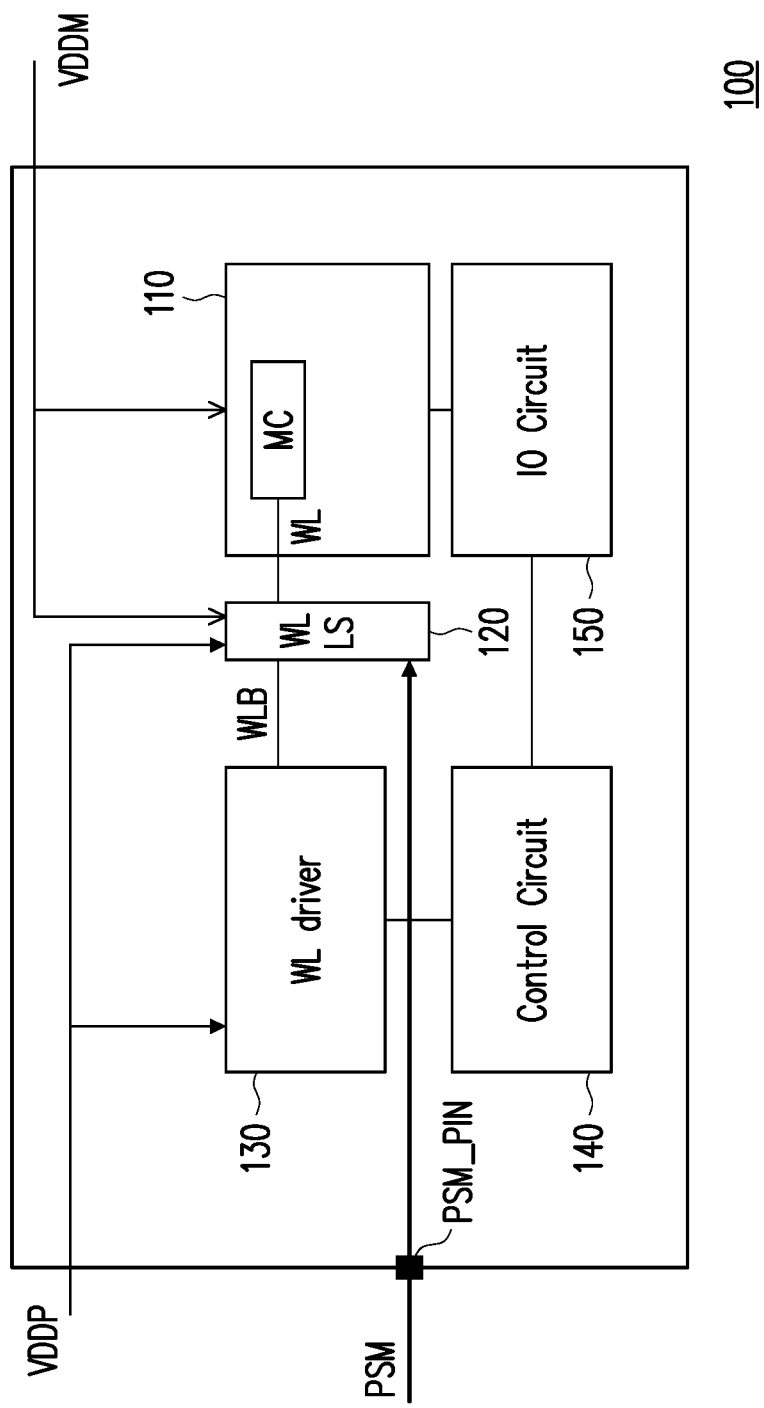
FIG. 1 is a schematic diagram of a memory device operable at a first voltage domain and a second voltage domain in accordance with some embodiments.

The following disclosure provides many different embodiments, or examples, for implementing different features present disclosure. Specific examples of components and arrangements are described below to simplify the present disclosure. These are, of course, merely examples and are not intended to be limiting. For example, the formation of a first feature over or on a second feature in the description at follows may include embodiments in which the first and second features are formed in direct contact, and may also include embodiments in which additional features may be formed between the first and second features, such that the first and second features may not be in direct contact in addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a schematic diagram of a memory device 100 that operates at multiple voltage domains (e.g., a VDDM domain and a VDDP domain) in accordance with some embodiments, where the VDDM and VDDP stand for supply voltages of different levels. The voltage levels of the VDDM domain are higher than voltage levels of the VDDP domain. In some embodiments, the memory device 100 is not equipped with a power management mode such as a shutdown (SD) mode and/or a deep-sleep (DSLP) mode. The power management of the memory device 100 is performed in a system level by a memory system that includes the memory device 100.

In some embodiments, the memory device 100 includes a memory array 110, a word line (WL) level shifter (LS) circuit 120, a WL driver 130, a control circuit 140 and an input/output (TO) circuit 150. The memory array 110 may include a plurality of memory cells MC that are configured to store data. The memory cells MC of the memory array 110 may be coupled to a plurality of word lines, a plurality of bit lines and a plurality of source lines, where a memory operation to the memory cells MC is performed through the word lines, the bit lines and the source lines. In some embodiments, the memory cells MC of the memory array 110 are static random-access memory cell (SRAM), but the disclosure is not limited to any particular type of memory cells. In some alternative embodiments, the memory cells MC may be phase-change random-access memory (PCRAM) cells, magnetoresistive random-access memory (MRAM) cells, resistive random-access memory (RRAM) cells, or any other suitable memory cells.

The WL driver 130 may drive the word lines of the memory array 110 according to a signal WLB that may be outputted by a row decoder (not shown). In some embodiments, the memory array 110 operates at the VDDM domain and the WL driver 130 operates at the VDDP domain. As the voltage domains of the WL driver 130 and the memory array 110 are different, the WL driver 130 drives the word lines of the memory array 110 through the WL level shifter circuit 120. The WL level shifter circuit 120 may operate at both the VDDM domain and the VDDP domain, and is configured to change the voltage domain of the signal WLB from the VDDP domain to the VDDM domain.

In some embodiments, the WL level shifter circuit 120 is further configured to clamp the word line to a predetermined voltage level (e.g., zero volt) that correspond to the logic state of "0" during a power saving mode of the memory device 100. The WL level shifter circuit 120 may receive a power saving mode enable signal PSM from outside of the memory device 100 through a pin PSM_PIN of the memory device 100. The power saving mode enable signal PSM is configured to enable memory device 100 to the power saving mode. For example, when the signal PSM is in a first logic state (e.g., logic state of 0), the memory device 100 is not in the power saving mode; and when the signal PSM is in a second logic state (e.g., logic state of 1), the memory device 100 is in the power saving mode. In some embodiments, the WL level shifter circuit 120 is configured to clamp the signal WL at the word line of the memory array 110 to the predetermined voltage level (e.g., zero volt) when the signal PSM is in the second logic state.

In some embodiments, the memory device 100 is included in the memory system, and the power management of the memory device 100 is performed in a system level and is shared for all memory devices included in the memory system. During a system-level SD mode or a system-level DSLP mode of the memory system, the voltage levels of the word lines of the memory array 110 are unknown and are within a range of voltage levels corresponding to logic states of "1" and "0", thus causing a large power leakage inside the memory device 100. In some embodiments, the signal PSM is in the second logic state when the memory system is in the system-level SD mode or the system-level DSLP mode. As the WL level shifter circuit 120 may clamp the word lines of the memory device 100 to the predetermined voltage level (e.g., 0 volt) during the power saving mode, the power leakage is prevented and the power consumption of the memory device 100 is reduced.

In some embodiments, the IO circuit 150 is coupled to the memory array 110 and is configured to communicate with the memory array 110 in different memory operations. In some embodiments, the IO circuit 150 may include a read circuit (not shown) that is configured to read data from the memory array 110, a write circuit (not shown) that is configured to write data to the memory array, and other suitable circuits that are required for operations of the memory device 100.

In some embodiments, the control circuit 140 includes control logic circuits that are configured to control overall operations of the memory device 100. The control circuit 140 may be coupled to the WL driver 130 and the IO circuit 150 to control the operations of the WL driver 130 and the IO circuit 150. For example, the control circuit 140 may send control signals to the WL driver 130 to control the driving of the WL driver 130. The control circuit 140 may send control signals to the IO circuit 150 to control operations of inputting or outputting data between the memory array 110 and other circuits.

Figure 2:
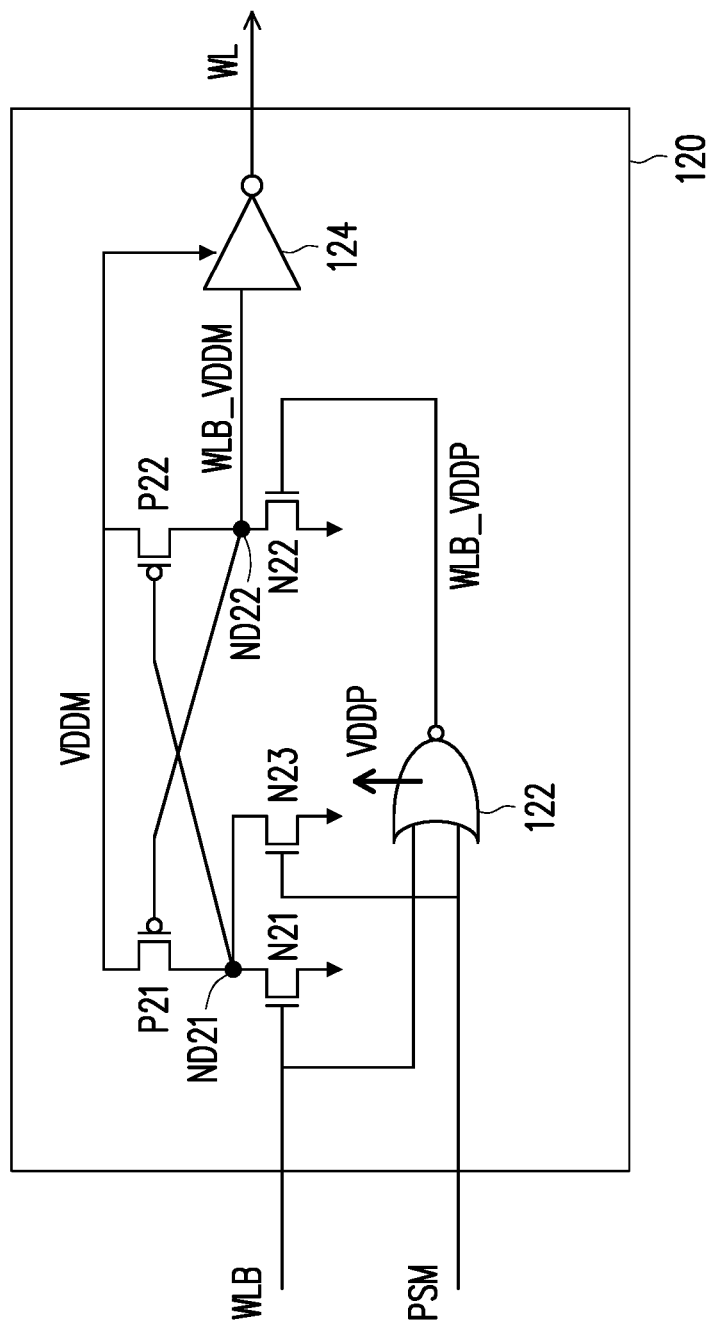
FIG. 2 is a schematic diagram of a word line level shifter circuit in accordance with some embodiments.

FIG. 2 is a schematic diagram of the WL level shifter circuit 120 as shown in FIG. 1 in accordance with some embodiments. The WL level shifter circuit 120 may include a plurality of transistors P21, P22, N21, N22 and N23, and logic circuits 122 and 124. The transistor P21 is cross-coupled to the transistor P22 through nodes ND21 and ND22. More particularly, the sources of the transistors P21 and P22 are coupled to each other to receive a voltage VDDM of the VDDM domain; and the drains of the transistors P21 and P22 are coupled to the nodes ND21 and ND22, respectively. The gate of the transistor P21 is coupled to the node ND22 and the gate of the transistor P22 is coupled to the node ND21.

In some embodiments, the drains of the transistors N21 and N23 are coupled to the node ND2, and the sources of the transistors N21 and N23 are coupled to a reference node (e.g., ground). The gates of the transistors N21 and N23 are configured to receive the signals WBL and PSM, respectively. As such, the switching operation of the transistor N21 is controlled by the signal WBL, and the switching operation of the transistor N23 is controlled by the signal PSM. During the power saving mode of the memory device (e.g., when the signal PSM is in the second logic state), the transistor N23 is turned on to clamp the node ND21 to zero volt. Accordingly, the transistor P22 is turned on and the node ND22 is clamped to the voltage level of the voltage VDDM. In other words, during the power saving mode of the memory device 100, the signal WLB_VDDM is clamped to the voltage level of the voltage VDDM.

In some embodiments, the logic circuit 122 that operates in the VDDP domain is coupled to the pin PSM_PIN to receive the signal PSM and is coupled to a row decoder (not shown) to receive the signal WLB. The logic circuit 122 may perform a logic operation to the signals WLB and PSM to output a signal WLB_VDDP. In some embodiments, the logic circuit 122 is a NOR logic gate that is configured to perform a NOR operation to the signals WLB and the PSM to generate the signal WLB_VDDP. The signal WLB_VDDP is provided to the gate of the transistor N22 to control switching operations of the transistor N22. During the power saving mode of the memory device, the signal PSM is in the second logic state of "1", thus the signal WLB_VDDP has the first logic state of "0" and the transistor N22 is turned off. In this way, the node ND22 is securely clamped to the voltage level of the voltage VDDM.

In some embodiments, the logic circuit 124 that operates in the VDDM domain has an input terminal coupled to the node ND22 and an output terminal coupled to the word line. The logic circuit 124 may perform a logic operation to the signal WLB_VDDM at the node ND22 to generate the signal WL at the output of the logic circuit 124. In some embodiments, the logic circuit 124 is an inverter or a NOT logic gate that is configured to invert the logic state of the signal WLB_VDDM to generate the signal WL. During the power saving mode of the memory device, the signal WLB_VDDM at the node ND22 is clamped to the level of the voltage VDDM. As such, the signal WL is clamped to the zero volt as the result of the inverting operation performed by the inverter 124. In this way, the WL level shifter circuit 120 may clamp the word line to zero volt during the power saving mode. As the word line is clamped to the zero volts during the power saving mode, the large power dissipation on the logic circuit 124 is reduced and the leakage current caused by the non-zero voltage level in the word line is prevented.

Figure 3:
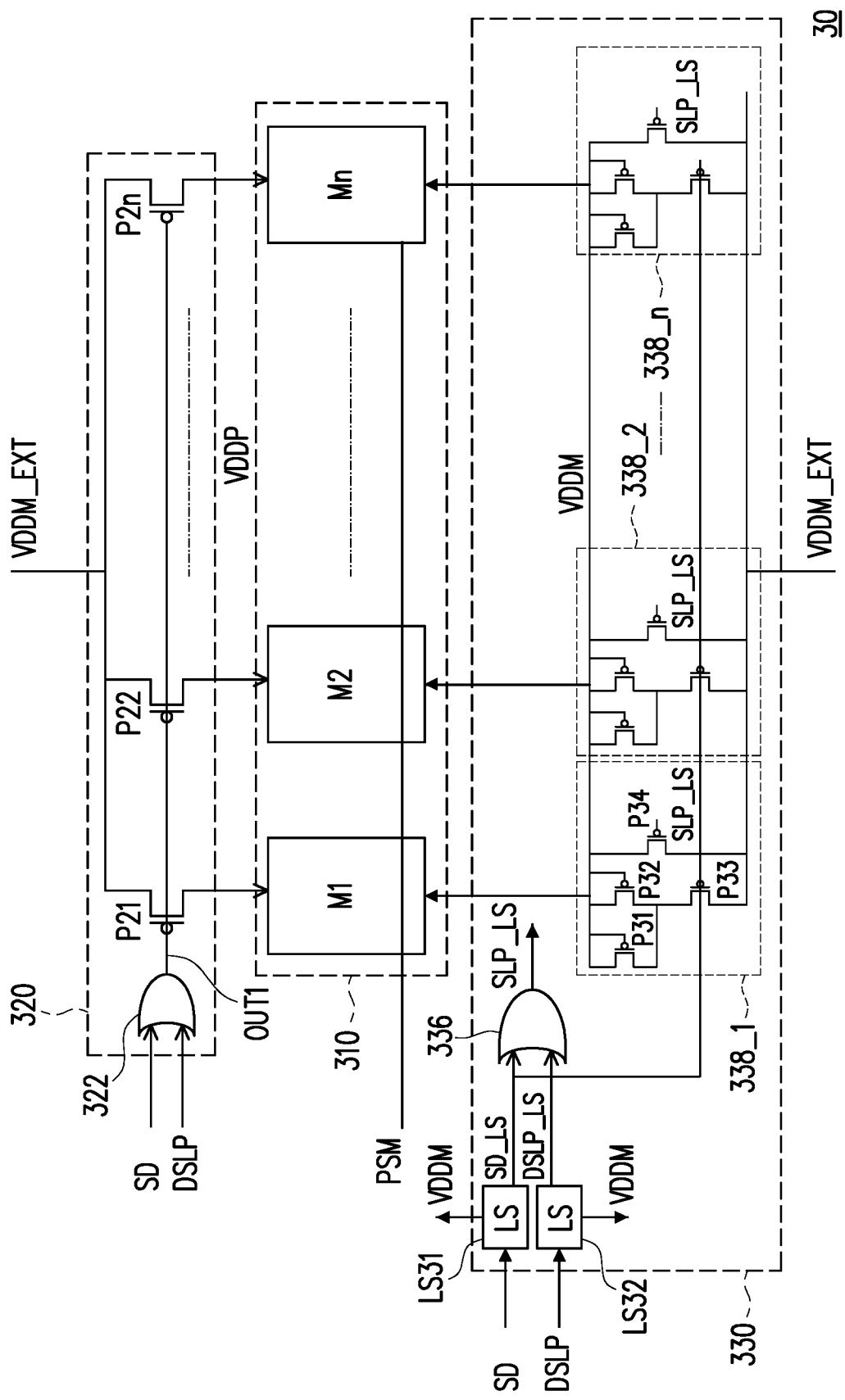
FIG. 3 is a schematic diagram of a memory system in accordance with some embodiments.

FIG. 3 is a schematic diagram of a memory system 30 that includes a memory block 310 and power management circuits 320 and 330 in accordance with some embodiments. The memory block 310 may include a plurality of memory devices M1 through Mn, where n is a positive integer. Each of the memory devices M1 through Mn may be same as or different from the memory 100 shown in FIG. 1. In some embodiments, the power management circuit 320 is coupled to the memory devices M1 through Mn and is configured to control the power supply in the VDDP domain for the memory devices M1 through Mn. In some embodiments, the power management circuit 330 is coupled to the memory devices M1 through Mn and is configured to control the power supply in the VDDM domain for the memory devices M1 through Mn.

In some embodiments, the power management circuit 320 includes a logic circuit 322 and a plurality of transistors P21 through P2n, in which the gates of the transistors P21 through P2n are coupled to an output OUT1 of the logic circuit 322. The transistors P21 through P2n are respectively coupled between the memory devices M1 through Mn and an external node that receives a voltage VDDP_EXT. The voltage VDDP_EXT is in the VDDP domain and may be referred to as an external voltage of the memory devices M1 through Mn. The transistors P21 through P2n are configured to control the supply of the voltage VDDP_EXT to the memory devices M1 through Mn based on the output OUT1 of the logic circuit 322. For example, when the output OUT1 of the logic circuit 322 is in the logic state of "0", the transistors P21 through P2n are configured to conduct the external node connecting to the voltage VDD_EXT to the memory devices M1 through Mn. When the output OUT1 of the logic circuit 322 is in the logic state of "1", the transistors P21 through P2n are configured to insulate the external node connecting to the voltage VDD_EXT from the memory devices M1 through Mn.

The logic circuit 322 may receive a shutdown signal SD and a deep-sleep signal DSLP, and perform a logic operation to the received inputs to generate the output OUT1. In some embodiments, the logic circuit 322 is an OR logic gate that is configured to perform an OR operation to the received shutdown signal SD and the deep-sleep signal DSLP to generate the output OUT1. In some embodiments, when the shutdown signal SD and the deep-sleep signal DSLP indicate that at least one of the shutdown mode and the deep-sleep mode is enabled, the output OUT1 of logic circuit 322 is configured to insulate the external voltage VDDP_EXT from the memory devices M1 through Mn. When the shutdown mode and the deep-sleep mode are not enabled, the transistors P21 through P2n are controlled to conduct the memory devices M1 through Mn to the voltage VDDP_EXT.

In some embodiments, the power management circuit 330 includes level shifters LS31 and LS32, a logic circuit 326, and circuits 338_1 through 338_n. The level shifters LS31 and LS31 receive the shutdown signal SD and the deep-sleep signal DSLP, respectively, and are configured to perform level shifting operations to generate signals SD_LS and DSLP_LS, respectively. The level shifters LS31 and LS31 operate at the VDDM domain, and the signals SD_LS and DSLP_LS are in the VDDM domain. The logic circuit 336 is coupled to the level shifters LS31 and LS32 to receive the signals SD_LS and DSLP_LS, and is configured to perform a logic operation to generate the signal SLP_LS. In some embodiments, the logic circuit 336 is an OR logic gate that is configured to perform the OR operation on the signals SD_LS and DSLP_LS to generate the signal SLP_LS.

In some embodiments, each of the circuits 338_1 through 338_n includes a plurality of transistors P21 through P34, and is configured to control the supply of the voltage VDDM_EXT to the memory devices M1 through Mn. For example, the circuit 338_1 includes transistors P21 through P34, in which the gate of the transistor P34 is controlled by the signal SLP_LS and the gate of the transistor P33 is controlled by the signal SD_LS. The transistors P31 and P32 are coupled between the transistor P33 and the memory device M1 and are configured as diodes.

In some embodiments, when the memory system 30 is in the shutdown mode, the shutdown signal SD is in the logic state of "1" and the deep-sleep signal DSLP is in the logic state of "0". As a result, the signals SD_LS and SLP_LS are in the logic state of "1" and the transistors P33 and P34 are turned off in the shutdown mode. Accordingly, the voltage VDDM_EXT is not supplied to the memory devices M1 through Mn during the shutdown mode. When the memory system 30 is in the deep-sleep mode, the shutdown signal SD is in the logic state of "0" and the deep-sleep signal DSLP is in the logic state of "1". As the deep-sleep signal DSLP is in the logic state of "1", the signal SLP_LS is in the logic state of "1" and the transistor P34 is turned off during the deep-sleep mode. As the shutdown signal SD is in the logic state of "0", the transistor P33 is turned on and the voltage VDDM_EXT is supplied to the memory devices M1 through Mn through the diodes P31 and P32. In this way, the data stored in the memory devices M1 through Mn are retained during the deep-sleep mode.

Figure 4:
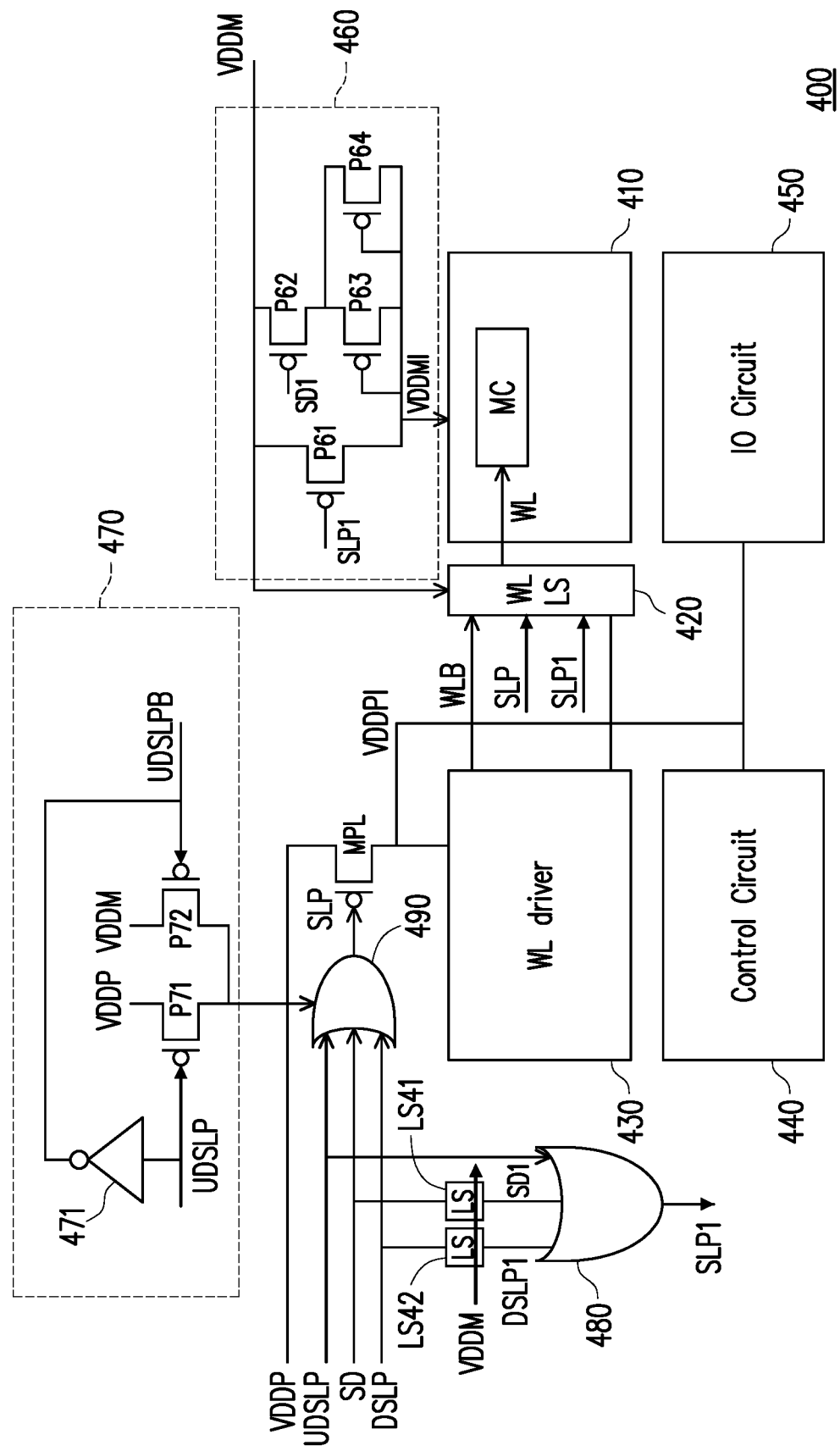
FIG. 4 is a schematic diagram of a memory device operable at a first voltage domain and a second voltage domain in accordance with some embodiments.

FIG. 4 is a schematic diagram of a memory device 400 that operates at multiple voltage domains (e.g., a VDDM domain and a VDDP domain) in accordance with some embodiments. The memory device 400 may include a memory array 410, a WL level shifter circuit 420, a WL driver 430, a control logic 440, an IO circuit 450, power management circuits 460 and 470, logic circuits 480 and 490, and level shifters LS41 and LS42. The memory array 410, the WL driver 430 and the control circuit 440 of the memory device 400 are similar to the memory array 110, the WL driver 130 and the control circuit 140 of the memory device 100 in FIG. 1, thus the detailed descriptions about these components are omitted hereafter.

In some embodiments, the WL level shifter circuit 420 operates at both the VDDM domain and the VDDP domain and is coupled between the WL driver 430 and the memory array 410. The WL level shifter circuit 420 is configured to change the voltage domain of the signal WLB from the VDDP domain to the VDDM domain to generate the signal WL. In addition, the WL level shifter circuit 420 is further configured to clamp the signal WL on the word line of the memory array 410 to zero volt during power saving modes of the memory device 400. In some embodiments, the memory device 400 is equipped with power management modes that may include a shutdown mode, a deep-sleep mode and an ultra-deep sleep mode, in which the data stored in the memory array 410 is not retained in the shutdown mode and the data stored in the memory array 410 is retained in the deep-sleep mode and the ultra-deep-sleep mode. The shutdown mode, the deep-sleep mode and the ultra-deep-sleep mode are enabled by the shutdown signal SD, the deep-sleep signal DSLP and an ultra-deep-sleep signal UDSLP, respectively. In some embodiments, the ultra-deep-sleep signal UDSLP is in the VDDM domain, and the shutdown signal SD and the deep-sleep signal DSLP are in the VDDP domain.

In some embodiments, the shutdown signal SD and the deep-sleep signal DSLP are inputted to the level shifters LS41 and LS42, respectively. The level shifters LS41 and LS42 are configured to shift the levels of the shutdown signal SD and the deep-sleep signal DSLP from the VDDP domain to the VDDM domain to generate the signals SD1 and DSLP1, respectively. The logic circuit 480 receives the signals SD1, DSLP1 and UDSLP, and is configured to perform a logic operation on the signals SD1, DSLP1 and UDSLP to generate the signal SLP1. In some embodiments, the logic circuit 480 is an OR logic gate that is configured to perform an OR logic operation on the signals SD1, DSLP1 and UDSLP to generate the signal SLP1. The level shifter LS41, LS42 and the logic circuit 480 may operate in the VDDM domain.

In some embodiments, the logic circuit 490 is configured to perform a logic operation on the signals SD, DSLP and UDSLP to generate the signal SLP. The logic circuit 490 may be an OR logic gate that may perform the OR logic operation on the signals SD, DSLP and UDSLP to generate the signal SLP. In some embodiments, the logic circuit 490 operates at VDDM domain when the memory device 400 is in the ultra-deep-sleep mode, and operates at the VDDP domain when the memory device 400 is not in the ultra-deep sleep mode. The supply of the voltages VDDM and VDDP in the VDDM domain and the VDDP domain is controlled by the power management circuit 470.

In some embodiments, the power management circuit 470 includes an inverter 471 and transistors P71 and P72, in which the gate of the transistor P71 is coupled to an input of the inverter 471 and the gate of the transistor P72 is coupled to an output of the inverter 471. The input of the inverter 471 may receive the ultra-deep-sleep signal UDSLP and the output of the inverter 471 is the signal UDSLPB, where the logic state of the signal UDSLPB is opposite to the logic state of the ultra-deep-sleep signal UDSLP. Particularly, when the ultra-deep-sleep signal UDSLP is at the logic state of "1", the signal UDSLPB is at the logic state of "0", and vice versa. In some embodiments, when the ultra-deep-sleep signal UDSLP is at the logic state of "1", the transistor P72 is turned on and the transistor P71 is turned off. Accordingly, the voltage VDDM is supplied to the logic circuit 490. When the ultra-deep-sleep signal UDSLP is at the logic state of "0", the transistor P72 is turned off, the transistor P71 is turned on, and the voltage VDDP is supplied to the logic circuit 490. In this way, during the ultra-deep-sleep mode, the supply of the voltage VDDP to the memory device 400 is not necessary. Thus, the supply of the voltage VDDP to the memory device 400 may be cut off, and more power is saved during the ultra-deep-sleep mode.

In some embodiments, the memory device 400 may further includes a power switch MPL, where a control terminal of the power switch MPL is coupled to the output of the logic circuit 490. In other words, the power switch MPL is controlled by the signal SLP that is generated by the logic circuit 490. The power switch MPL may has a first terminal coupled to the voltage VDDP and a second terminal coupled to a bus which may connect to subsequent circuits such as the WL level shifter circuit 420, the WL driver 430, the control circuit 440 and the IO circuit 450. The power switch MPL is configured to output the voltage VDDPI to the bus based on the control of the signal SLP. During the shutdown mode or the deep-sleep mode, if the voltage VDDPI is floated, there is a considerable leakage flowing in the subsequent circuits such as the WL level shifter circuit 420, the WL driver 430, the control circuit 440 and the IO circuit 450. In some embodiments, during the ultra-deep-sleep mode, the power switch MPL is turned off and the voltage VDDPI is clamped to the zero volt. As the voltage VDDPI is clamped to zero volt during the ultra-deep-sleep mode, the leakage flowing in the subsequent circuits is reduced.

In some embodiments, during the shutdown mode or the deep-sleep mode, the logic circuit 490 is supplied with the voltage VDDP and is configured to output the signal SLP having the logic state of "1". Accordingly, the power switch MPL is turned off and the voltage VDDPI that is outputted by the power switch MPL is clamped to the zero volt. As the voltage VDDPI is clamped to zero volt during the shutdown mode and the deep-sleep mode, the leakage flowing in the subsequent circuits is reduced. In some embodiments, during a non-power saving mode (or a normal operation mode), the signal SLP is in the logic state of "0", and the power switch MPL is turned on to supply the voltage VDDP to the WL level shifter circuit 420, the WL driver 430, the control circuit 440 and the IO circuit 450.

In some embodiments, the power management circuit 460 includes a plurality of transistors P61 through P64, in which the gate of the transistor P61 receive the signal SLP1 from the logic circuit 480, and the gate of the transistor P62 receives the signal SD1 from the level shifter LS41. The transistors P63 and P64 functions as diodes, and are coupled between the transistor P62 and the memory array 410. In some embodiments, when the memory device 400 is in the shutdown mode, the signal SD is in the logic state of "1" and the signals DSLP and UDSLP are in the logic state of "0". Accordingly, the signals SD1 and SLP1 are in the logic state of "1" and the transistors P61 and P62 are turned off, thus insulating the memory array 410 from the voltage VDDM. When the memory device 400 is in the deep-sleep mode or in the ultra-deep-sleep mode, the signal SLP1 is in the logic state of "1" and the signal SD1 is in the logic state of "0". Accordingly, the transistor P62 is turned on and the voltage VDDM is supplied to the memory array 410 through the transistors P62, P63 and P64. The voltage VDDM is turned to the voltage VDDMI as the voltage drops on the transistors P62 through P64. As the voltage VDDMI is supplied to the memory array 410 during the deep-sleep mode and the ultra-deep-sleep mode, the data stored in the memory array 410 is retained during the deep-sleep mode and the ultra-deep-sleep mode.

Figure 5:
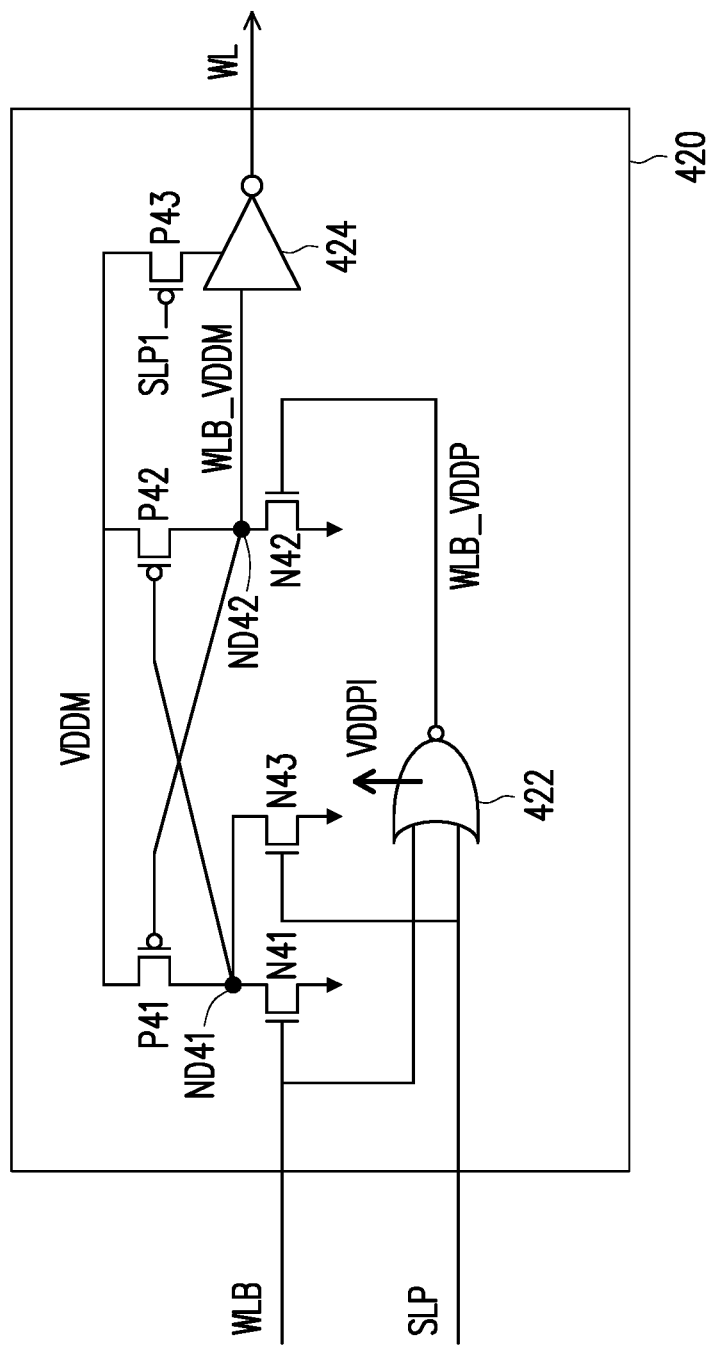
FIG. 5 is a schematic diagram of a word line level shifter circuit in accordance with some embodiments.

FIG. 5 illustrate a schematic diagram of the WL level shifter circuit 420 of the memory device 400 shown in FIG. 4 in accordance with some embodiments. The WL level shifter circuit 420 may include a plurality of transistors P41, P42, N41, N42 and N43, and logic circuits 422 and 424. The transistors P41, P42, N41, N42, N43 and nodes ND41 and ND42 are similar to the transistors P21, P22, N21, N22, N23 and nodes ND21 and ND22 in FIG. 2, thus the detailed descriptions of these components are omitted hereafter.

A difference between the WL level shifter circuit 120 and the WL level shifter circuit 420 is that the logic circuit 422 of the WL level shifter circuit 420 may receive the signal WLB and SLP, in which the signal SLP is generated by the logic circuit 490 in FIG. 4. The logic circuit 422 may operate in the VDDP domain and is configured to perform a logic operation (e.g., NOR operation) to the signals WLB and SLP to generate the signal WLB_VDDP. The signal WLB_VDDP is provided to the gate of the transistor N42. Another difference between the WL level shifter circuit 120 and the WL level shifter circuit 420 is that the WL level shifter circuit 420 further includes the transistor P43 that is coupled between the logic circuit 424 and the voltage VDDM, where the gate of the transistor P43 is configured to receive the signal SLP1.

In some embodiments, when the memory device 400 operates in the shutdown mode or the deep-sleep mode, the signal SLP that is in the VDDP domain, and when the memory device 400 operates in the ultra-deep-sleep mode, the signal SLP that is in the VDDM domain. In addition, when the memory device 400 operates in the shutdown mode, the deep-sleep mode or the ultra-deep-sleep mode, the signal SLP is in the logic state of "1" and the transistor N43 is turned on to clamp the node N41 to zero volt. Accordingly, the transistor P42 is turned on to clamp the node ND42 to the level of the voltage VDDM. In addition, as the signal SLP is in the logic state of "1", the signal WLB_VDDP that is generated by the logic circuit 422 is in the logic state of "0". Accordingly, the transistor N42 is turned off and the node ND42 is securely clamped to the level of the voltage VDDM. In some embodiments, the logic circuit 424 is an inverter that is configured to invert the logic state of the signal WLB_VDDM at the node ND42 to generate the signal WL that is clamped to zero volt. In this way, the word line of the memory array 410 is clamped to zero volt during the shutdown mode, the deep-sleep mode and the ultra-deep-sleep mode. As such, the large power dissipation on the logic circuit 124 is reduced and the leakage current caused by the non-zero voltage level in the word line is prevented.

Figure 6:
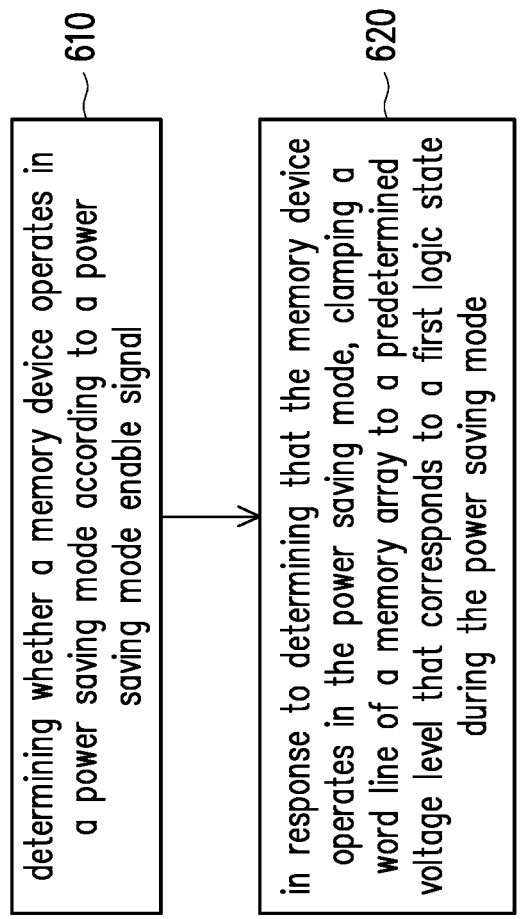
FIG. 6 is a flowchart diagram illustrating a power management method of compensating a mismatch in a circuit in accordance with some embodiments.

FIG. 6 is a flowchart diagram illustrating a power management method of compensating a mismatch in a circuit in accordance with some embodiments. In step S610, it determines whether a memory device operates in a power saving mode according to a power saving mode enable signal. In step S620, in response to determining that the memory device operates in the power saving mode, a word line of a memory array is clamped to a predetermined voltage level that corresponds to a first logic state during the power saving mode. In some embodiments, the predetermined voltage level is zero volt. As the word line of the memory device is clamped to zero volt during the power saving mode, the power dissipation and leakage power are reduced in the memory device.

In accordance with some embodiments, a word line level shifter circuit of the memory device is configured to clamp a word line voltage of a memory array to zero volt during a power saving mode of the memory device. As such, the power dissipation of the word line level shifter circuit and the power leakage of the memory device during the power saving mode is prevented. Accordingly, power consumption of the memory device in the power saving mode is reduced. In some embodiments, a power management circuit are included in the memory device for providing a first voltage in the VDDM domain during an ultra-deep-sleep mode and for providing a second voltage in the VDDP domain during the other power saving mode (e.g., shutdown mode and deep-sleep mode). In this way, the supply of the external VDDP during the ultra-deep-sleep mode is not necessary and may be insulated from the memory device. Furthermore, during the ultra-deep-sleep mode, a power switch of the memory device is turned off, thereby preventing the leaking current to the subsequent circuits that are coupled to the power switch. Accordingly, more power is saved in the ultra-deep-sleep mode of the memory device.

In accordance with some embodiments, a memory device that is operable at a first voltage domain and a second voltage domain includes a memory array, a power saving mode pin and a word line level shifter circuit. The memory array operates at the first voltage domain. The power saving mode pin is configured to receive a power saving mode enable signal that is at the second voltage domain. The power saving mode enable signal is configured to enable a power saving mode of the memory device. The word line level shifter circuit is coupled to the memory array and the power saving mode pin, and is configured to clamp a word line of the memory array to a predetermined voltage level that corresponds to a first logic state during the power saving mode of the memory device.

In accordance with some embodiments, a memory device that is operable at a first voltage domain and a second voltage domain includes a memory array, a first logic circuit and a word line level shifter circuit. The memory array is configured to operate at the first voltage domain. The first logic circuit is configured to operate at the first voltage domain when the memory device is in a first power saving mode and to operate at the second voltage domain when the memory device is not in the first power saving mode. The word line level shifter circuit is coupled to the memory array, configured to clamp a word line of the memory array to a predetermined voltage level that corresponds to a first logic state during the first power saving mode of the memory device. The predetermined voltage level may be zero volt.

In accordance with some embodiments, a power management method for a memory device operable at a first voltage domain and a second voltage domain is introduced. The power management method includes steps of determining whether the memory device operates in a power saving mode according to a power saving mode enable signal; and in response to determining that the memory device operates in the power saving mode, clamping a word line of a memory array to a predetermined voltage level that corresponds to a first logic state during the power saving mode.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A memory device operable at a first voltage domain and a second voltage domain, the memory device comprising:
   a memory array, configured to operate at the first voltage domain;
   a power saving mode pin, configured to receive a power saving mode enable signal that is at the second voltage domain, wherein the power saving mode enable signal is configured to enable a power saving mode of the memory device; and
   a word line level shifter circuit, coupled to the memory array and the power saving mode pin, configured to clamp a word line of the memory array to a predetermined voltage level that corresponds to a first logic state during the power saving mode of the memory device, wherein
   the power saving mode pin is configured to receive the power saving mode enable signal from outside of the memory device,
   when the power saving mode enable signal is in the first logic state, the memory device is not in the power saving mode, and
   when the power saving mode enable signal is in a second logic state, the memory device is in the power saving mode.

2. The memory device of claim 1, wherein
   voltage levels of the first voltage domain are higher than voltage levels of the second voltage domain, and
   the predetermined voltage level corresponding to the first state is zero volt.

3. The memory device of claim 1, wherein the word line level shifter circuit comprises:
   a first node;
   a first transistor, coupled to the first node and the power saving mode pin, configured to clamp the first node to the first logic state during the power saving mode based on the power saving mode enable signal;
a second node; and
a second transistor, coupled to the first node and the second node, configured to clamp the second node to the second logic state during the power saving mode.

4. The memory device of claim 3, wherein the word line level shifter circuit further comprises:
a logic circuit, operated at the first voltage domain, having an input terminal coupled to the second node and an output terminal coupled to the word line, and configured to perform a logic operation to clamp the word line to the predetermined voltage level that corresponds to the first logic state during the power saving mode.

5. The memory device of claim 4, wherein
the logic circuit is an inverter circuit that is configured to invert a logic state at the second node to clamp the word line to the predetermined voltage level that corresponds to the first logic state during the power saving mode.

6. A memory device operable at a first voltage domain and a second voltage domain, the memory device comprising:
a memory array, configured to operate at the first voltage domain;
a first logic circuit, configured to operate at the first voltage domain when the memory device is in a first power saving mode and to operate at the second voltage domain when the memory device is not in the first power saving mode; and
a word line level shifter circuit, coupled to the memory array, configured to clamp a word line of the memory array to a predetermined voltage level that corresponds to a first logic state during the first power saving mode of the memory device, wherein
the first logic circuit comprises:
a first input terminal, receiving a first power saving mode enable signal;
a second input terminal, receiving a second power saving mode enable signal;
a third input terminal, receiving a third power saving mode enable signal; and
an output terminal, configured to output a first control signal that is obtained by performing a first logic operation on the first power saving mode enable signal, the second power saving mode enable signal and the third power saving mode enable signal.

7. The memory device of claim 6, wherein
the memory device operates in the first power saving mode when the first power saving mode enable signal is in the second logic state,
the memory device operates in a second power saving mode when the second power saving mode enable signal is in the second logic state, and
the memory device operates in a third power saving mode when the third power saving mode enable signal is in the second logic state.

8. The memory device of claim 7, further comprising:
a power switch, having a control terminal coupled to the first logic circuit and an output terminal coupled to a bus, configured to perform a switching operation according to the first control signal,
wherein the power switch is configured to clamp the bus to the predetermined voltage level corresponding to the first logic state during the first power saving mode, the second power saving mode and the third power saving mode.

9. The memory device of claim 6, further comprising:
a first level shifter, configured to convert the second power saving mode enable signal from the second voltage domain to the first voltage domain to generate a first shifted signal;
a second level shifter, configured to convert the third power saving mode enable signal from the second voltage domain to the first voltage domain to generate a second shifted signal; and
a second logic circuit, configured to receive the first shifted signal, the second shifted signal and the first power saving mode enable signal, and perform a second logic operation to the first shifted signal, the second shifted signal and the first power saving mode enable signal to generate a second control signal, wherein the second logic circuit operate in the first voltage domain and the first power saving mode enable signal is in the first voltage domain.

10. The memory device of claim 9, wherein the word line level shifter circuit comprises:
a first node;
a first transistor, coupled to the first node, configured to clamp the first node to the first logic state during the first power saving mode, the second power saving mode and the third power saving mode of the memory device;
a second node; and
a second transistor, coupled to the first node and the second node, configured to clamp the second node to the second logic state during the first power saving mode, the second power saving mode and the third power saving mode of the memory device.

11. The memory device of claim 10, wherein the word line level shifter circuit further comprises:
a third logic circuit, operated at the first voltage domain, having an input terminal coupled to the second node and an output terminal coupled to the word line, configured to clamp the word line to the predetermined voltage level that corresponds to the first logic state during the first power saving mode, the second power saving mode and the third power saving mode.

12. The memory device of claim 9, further comprising:
a first power management circuit, coupled to the memory array, configured to supply a first voltage in the first voltage domain to the memory array during the first power saving mode and the third power saving mode and to stop supplying the first voltage to the memory array during the second power saving mode,
wherein the power management circuit comprises:
a first switch, coupled to the second logic circuit to receive the second control signal, configured to perform a switching operation based on the second control signal; and
a second switch, coupled to the first level shifter to receive the first shifted signal, configured to perform a switching operation based on the first shifted signal.

13. The memory device of claim 6, further comprising:
a second power supply circuit, coupled to the first logic circuit, configured to supply a first voltage in the first voltage domain to the first logic circuit when the first power saving mode is enabled and supply a second voltage in the second voltage domain to the first logic circuit when the power saving mode is disabled,
wherein the power supply circuit comprises:
an inverter, configured to receive the first power saving mode enable signal and generate an inverted signal of the first power saving mode enable signal;

a third switch, having a control terminal configured to receive the first power saving mode enable signal, and configured to supply the second voltage in the second voltage domain to the first logic circuit when the power saving mode is disabled; and a fourth switch, having a control terminal configured to receive the inverted signal of the first power saving mode enable signal, and configured to supply the first voltage in the first voltage domain to the first logic circuit when the power saving mode is enabled.

14. The memory device of claim 6, wherein
the first voltage domain is higher than the second voltage domain, and
the predetermined voltage level corresponding to the first logic state is zero volt.

15. A power management method, adapted to a memory device operable at a first voltage domain and a second voltage domain, wherein the memory device comprises a memory array operating at the first voltage domain, the method comprising:

receiving a power saving mode enable signal that is at the second voltage domain from outside of the memory device through a power saving mode pin;

determining whether the memory device operates in a power saving mode according to the power saving mode enable signal, wherein when the power saving mode enable signal is in the first logic state, it is determined that the memory device is not in the power saving mode; and when the power saving mode enable signal is in a second logic state, it is determined that the memory device is not in the power saving mode; and in response to determining that the memory device operates in the power saving mode, clamping a word line of a memory array to a predetermined voltage level that corresponds to a first logic state during the power saving mode.

16. The power management method of claim 15, wherein the word line is clamped to the predetermined voltage level that corresponds to the first logic state during the power saving mode by a word line level shifter circuit, and the word line level shifter circuit comprises:

a first node;
a first transistor, coupled to the first node, configured to clamp the first node to the first logic state during the power saving mode of the memory device;
a second node; and
a second transistor, coupled to the first node and the second node, configured to clamp the second node to the second logic state during the power saving mode of the memory device.

17. The power management method of claim 16, wherein clamping the word line of the memory array to the predetermined voltage level that corresponds to the first logic state during the power-saving mode comprises:

turning on the first transistor during the power saving mode to clamp the first node to the first logic state during the power saving mode;
turning on the second transistor during the power saving mode to clamp the first node to the second logic state during the power saving mode; and
performing a logic operation on a signal in the second node to clamp the word line of the memory array to the first logic state during the power saving mode.

18. The power management method of claim 16, wherein the word line level shifter circuit further comprises:

a logic circuit, operated at the first voltage domain, having an input terminal coupled to the second node and an output terminal coupled to the word line, and configured to perform a logic operation to clamp the word line to the predetermined voltage level that corresponds to the first logic state during the power saving mode.

19. The power management method of claim 16, wherein performing the logic operation on the signal in the second node to clamp the word line of the memory array to the first logic state during the power saving mode comprises:

inverting a logic state at the second node to clamp the word line to the predetermined voltage level that corresponds to the first logic state during the power saving mode.

20. The power management method of claim 15, wherein voltage levels of the first voltage domain are higher than voltage levels of the second voltage domain, and
the predetermined voltage level corresponding to the first state is zero volt.

* * * * *